(12) United States Patent
Mochizuki

(10) Patent No.: US 8,216,386 B2
(45) Date of Patent: Jul. 10, 2012

(54) ATMOSPHERE EXCHANGE METHOD

(75) Inventor: Shinya Mochizuki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 921 days.

(21) Appl. No.: 12/062,649

(22) Filed: Apr. 4, 2008

(65) Prior Publication Data
US 2008/0247846 A1 Oct. 9, 2008

(30) Foreign Application Priority Data

Apr. 6, 2007 (JP) .................................. 2007-100301
Mar. 24, 2008 (JP) .................................. 2008-075897

(51) Int. Cl.
*B08B 17/00* (2006.01)
(52) U.S. Cl. ........................ 134/19; 134/21; 134/35
(58) Field of Classification Search .................. None
See application file for complete search history.

(56) References Cited

U.S. PATENT DOCUMENTS

| 6,177,661 | B1 | 1/2001 | Lee et al. |
| 2005/0252455 | A1* | 11/2005 | Moriya et al. ................ 118/729 |
| 2006/0066834 | A1* | 3/2006 | Phillips et al. .................. 355/75 |

FOREIGN PATENT DOCUMENTS

| JP | 2886521 A | 6/1998 |
| KR | 10-1998-0021195 | 6/1998 |

OTHER PUBLICATIONS

K. Okuyama et al., New System Chemical Engineering, Fine Particles Engineering, May 1992, pp. 106-107, Ohmsha Publishing.

* cited by examiner

*Primary Examiner* — Michael Kornakov
*Assistant Examiner* — Ryan Coleman
(74) *Attorney, Agent, or Firm* — Canon U.S.A., Inc. IP Division

(57) ABSTRACT

There is provided a method for exchanging an atmosphere of a vacuum chamber of a processing apparatus configured to process a substrate under a vacuum environment. The method includes the steps of holding the substrate using a holding unit provided in the vacuum chamber, and exchanging the atmosphere of the vacuum chamber through exhaustion or air supply, wherein the exchanging step maintains a pressure of the vacuum chamber in a range between 10 Pa and 10000 Pa for a period between 10 seconds and 600 seconds while controlling a temperature of a dust collection unit provided in the vacuum chamber lower than a temperature of the substrate.

9 Claims, 8 Drawing Sheets

ATMOSPHERE EXCHANGE METHOD

BACKGROUND OF THE INVENTION

1. Field of the Invention

The present invention relates to an atmosphere exchange method.

2. Description of the Related Art

A conventional load lock chamber imports a substrate from a substrate stocker that is placed in the atmosphere environment, into a processing chamber that processes the substrate in the vacuum atmosphere, or exports a processed substrate from the processing chamber to the substrate stocker. The processing chamber, as used herein, means a EUV (extreme ultraviolet) exposure apparatus and a plasma processing apparatus.

The load lock chamber serves to exchange an atmosphere in the internal space between the atmosphere environment and the vacuum environment. More specifically, the load lock chamber exchanges the atmosphere from the atmosphere environment to the vacuum environment in importing the substrate into the processing chamber (in the exhaust process), and exchanges the atmosphere from the vacuum environment to the atmosphere environment in exporting the substrate to the substrate stocker (in the air-supply process). The load lock chamber is connected to the processing chamber via a gate valve, and includes a substrate transport mechanism.

However, particles swirl from the gate valve and the substrate transport mechanism in the air-supply and exhaust time, and a means is necessary to reduce or prevent their adhesions to the substrate. One proposed method reduces particles' adhesions to the substrate utilizing the thermophoretic force. As disclosed in Japanese Patent No. 2,886,521, this method heats the holder of the substrate up to a temperature higher than the peripheral temperature, and collects particles via a low-temperature particle collector maintained at a temperature lower than the peripheral temperature.

According to the principle of the thermophoretic force, with a temperature gradient in the gas around the particles, the particles are given the kinetic energy from the gas molecules at the high temperature side higher than that of the gas molecules at the low temperature side, and move from the object at the high temperature side to the low temperature side. Thermophoretic force Fx is given by the following equation by the thermophoresis coefficient equation described in Kikuo Okuyama, Hiroaki Masuda, and Seiji Morooka, "New System Chemical Engineering, Fine Particles Engineering," pp. 106-107, May of 1992, Ohmsha Publishing.

$$Fx = \frac{-6\pi D_p \mu^2 C_s (K + C_t K_n)}{\rho (1 + 3 C_m K_n)(1 + 2K + 2 C_t K_n)} \cdot \frac{1}{T} \cdot \frac{\Delta T}{\Delta x} \quad \text{EQUATION 1}$$

Equation 1 assumes that the particle is spherical and the fluid is the ideal gas. $D_p$ is a particle diameter. T is a gas temperature. $\mu$ is a viscosity coefficient. $\rho$ is a gas density. Kn is a Knudsen number and $2\lambda/D_p$. $\lambda$ is a mean free path and $\eta/\{0.499 P(8M/\pi RT)^{1/2}\}$. M is a molecular weight. R is a gas constant. K is k/kP. k is a thermal conductivity of the gas only caused by the parallel movement energy. kp is the thermal conductivity of the particle. Cs is 1.17. Ct is 2.18. Cm is 1.14. $\Delta T/\Delta x$ is a temperature gradient.

The dimension of the load lock chamber is restricted by the gate opening size (W360 mm×H80 mm) determined by the uniform standard in the semiconductor field, and cannot be made as small as the substrate's external shape. Therefore, the thermophoretic force near the substrate holder inevitably depends upon a shape of the load lock chamber, and thus cannot be maximized.

SUMMARY OF THE INVENTION

The present invention is directed to an atmosphere exchange method that reduces adhesions of particles to the substrate in a vacuum chamber. The "vacuum chamber," as used in the following embodiments, means an apparatus that needs a reduced pressure state in principle like an exposure chamber in a EUV exposure apparatus, and an apparatus that temporarily holds the reduced pressure state like a load lock chamber of a substrate transport mechanism.

An atmosphere exchange method according to one aspect of the present invention is a method for exchanging an atmosphere of a vacuum chamber of a processing apparatus configured to process a substrate under a vacuum environment. The method includes the steps of holding the substrate using a holding unit provided in the vacuum chamber, and exchanging the atmosphere of the vacuum chamber through exhaustion or air supply, wherein the exchanging step maintains a pressure of the vacuum chamber in a range between 10 Pa and 10000 Pa for a period between 10 seconds and 600 seconds while controlling a temperature of a dust collection unit provided in the vacuum chamber lower than a temperature of the substrate.

Further features of the present invention will become apparent from the following description of exemplary embodiments (with reference to the attached drawings).

DESCRIPTION OF THE EMBODIMENTS

Figure 1:
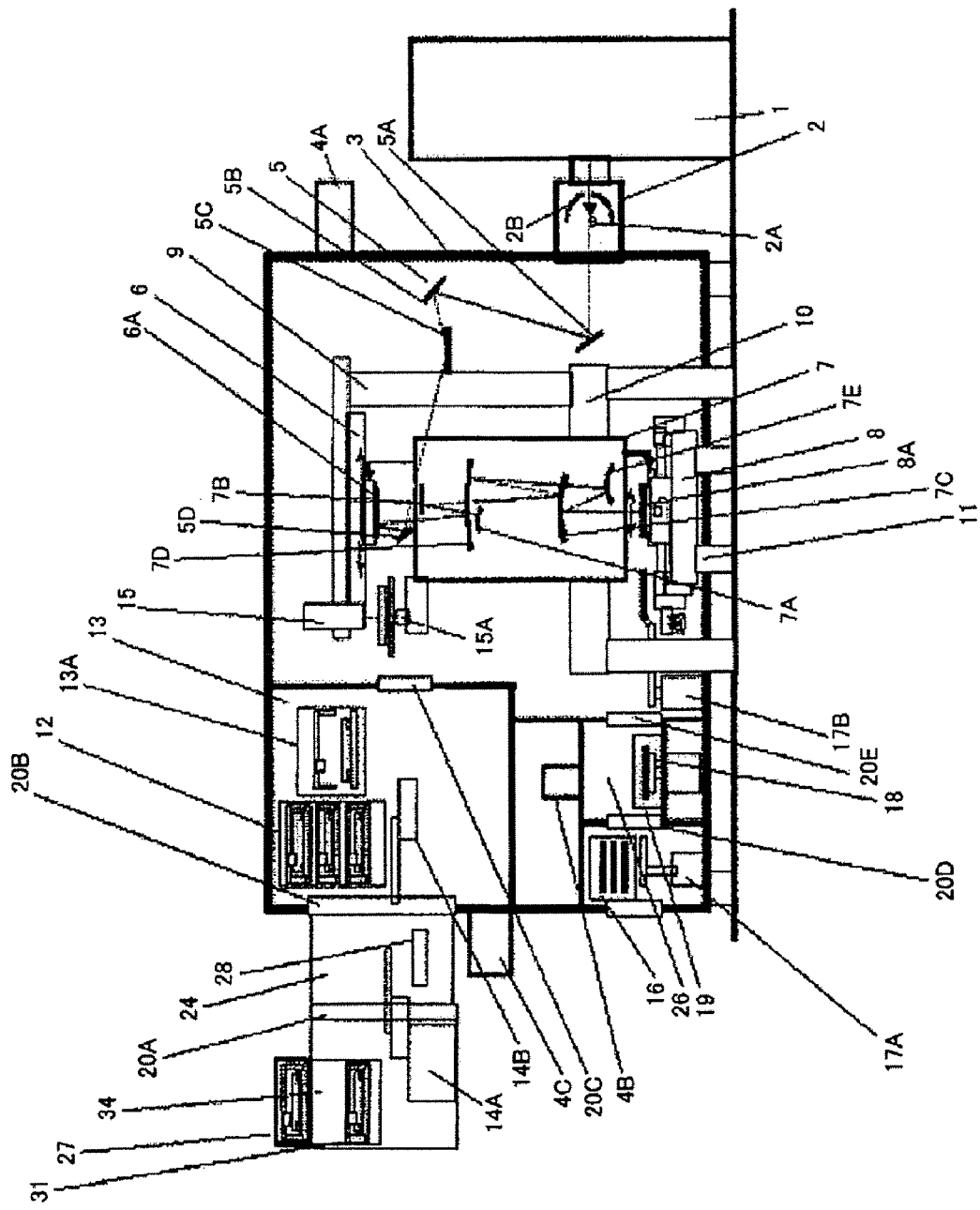
FIG. 1 is a schematic sectional view of an exposure apparatus according to a first embodiment of the present invention.

Referring now to the accompanying drawings, a description will be given of a processing apparatus according to the embodiment of the present invention. This embodiment uses an EUV exposure apparatus as a processing apparatus that processes a substrate under a vacuum environment, but the present invention is not limited to the processing apparatus.
First Embodiment FIG. 1 is a schematic sectional view of an exposure apparatus according to the first embodiment. In FIG. 1, 1 denotes an excitation laser, and uses a YAG solid laser, etc. The excitation laser 1 irradiates a laser beam to an emission point of a light source, and emits the light for plasma excitation of the light source material atoms. The point is made by gasifying, liquefying, or spraying a light source material. 2 denotes a light source emission part in the exposure light source which maintains vacuum in its inside. 2A denotes an emission point of the exposure light source. 2B denotes a light source mirror arranged as a semispherical mirror around the emission point 2A so as to deflect, condense and reflect the overall spherical light from the emission point 2A towards the emission direction. A nozzle (not shown) is used to emit liquefied Xe, liquefied Xe spray, or Xe gas as an emission atom to the emission point 2A, and the light from the excitation laser 1 is irradiated to the emission point 2A.

3 denotes an exposure chamber (processing chamber) connected to the light source emission part 2. The exposure chamber 3 is maintained under a vacuum environment or at a reduced pressure by an exhausting unit (vacuum pump) 4A. The exposure chamber 3 is a vacuum chamber that can maintain the vacuum pressure suitable for the EUV exposure. 5 denotes an illumination optical system that introduces and shapes the exposure light from the light source emission part 2, includes mirrors 5A to 5D, and homogenizes and shapes the exposure light. 6 denotes a reticle stage, and a reticle (original) 6A is electrostatically held as a reflective original having an exposure pattern, on a movable part of the reticle stage 6.

7 denotes a projection optical system that projects a reduced image of an exposure pattern reflected from the reticle 6A, onto a wafer 8A at a preset reduction ratio via mirrors 7A to 7E sequentially in this order to reflect an exposure pattern reflected by the reticle 6A. 8 denotes a wafer stage that positions to an exposure position a wafer 8A as a Si substrate, to which the reticle pattern is exposed, so as to control the position of the wafer stage in six axes directions including XYZ axes directions, tilting directions around the X-axis and Y-axis, and a rotational direction around the Z-axis.

9 denotes a support member that supports the reticle stage 6 on the floor. 10 denotes a support member that supports the projection optical system 7 on the floor. 11 denotes a support member that supports the wafer stage 8 on the floor. A control unit (not shown) measures and continuously maintains a relative position between the reticle stage 6 and the projection optical system 7 and a relative position between the projection optical system 7 and the wafer stage 8. The support members 9 to 11 each have a mount (not shown) that isolates the vibration from the floor.

16 denotes a wafer stocker that temporarily stores a wafer 8A inside the apparatus, which has been carried by a wafer carrier unit 17A at the atmospheric air side. The wafer stocker 16 stores plural wafers. The wafer 8A to be exposed is sorted from the wafer stocker 16, and transported to the holding unit 18 that is installed in the vacuum chamber or the load lock chamber 26. 19 denotes a shield (dust collection unit), which encloses the periphery of the wafer. 20D is a gate valve that connects the space of the wafer stocker 16 to the load lock chamber 26, and opens and closes when the load lock chamber 26 is in the atmosphere pressure state. 20E is also a gate valve that connects the load lock chamber 26 to the exposure chamber 3, and opens and closes when the load lock chamber 26 is in the vacuum state. The wafer carrier unit 17B that can transport a wafer in the vacuum state carries the wafer from the holding unit 18 to a wafer mechanical pre-alignment temperature controller (not shown) that is placed in the exposure chamber (processing chamber). The wafer mechanical pre-alignment temperature controller provides rough feeding adjustments in the wafer's rotating direction as well as controlling the wafer temperature to the reference temperature of the exposure apparatus. The wafer carrier unit 17B feeds to the wafer stage 8 the wafer 8A aligned and temperature-controlled by the wafer mechanical pre-alignment temperature controller.

An export procedure of the wafer 8A from the exposure chamber 3 is opposite to the loading procedure.

27 denotes an SMIF pod as a miniature environment used to transport a reticle cassette in the device factory. 31 denotes a reticle cassette held in the SMIF pod. As soon as an SMIF indexer 34 opens and closes the SMIF pod, the reticle cassette 31 is introduced into the exposure apparatus so that the reticle carrier unit 14A is ready to carry the reticle cassette 31. 24 denotes a load lock chamber used to exchange an atmosphere for the reticle cassette 31 from the air atmosphere to the vacuum atmosphere, and includes a cassette holding unit 28.

20A denotes a gate valve that connects the space of the reticle cassette 31 to the load lock chamber 24, and opens and closes when the load lock chamber 24 is in the atmosphere pressure state. It is a gate opening/closing mechanism that imports the reticle 6A into the holding unit of the load lock chamber 24 from the SMIF indexer 34. 20B denotes also a gate valve that opens and closes when the load lock chamber 24 is in the vacuum state. 20C denotes also a gate valve that opens and closes in importing the reticle 6A into the exposure chamber 3.

12 denotes a reticle stocker that temporarily stores the reticle 6A carried from the outside of the apparatus to the inside of the apparatus while the reticle 6A is housed in the reticle cassette 31. The reticle stocker 12 stores the reticles 6A having different patterns and different exposure conditions at multiple stages.

14A denotes a reticle carrier unit that carries the reticle cassette 31 to the reticle stocker 12 from the load lock chamber 24. The reticle carrier unit 14B is arranged in a reticle carrier chamber 13, selects a target reticle from the reticle stocker 12, and transports the reticle cassette 31 to a lid opening mechanism 13A that divides it into a cassette's upper lid and a cassette's lower plate. The reticle carrier unit 14B transports the cassette's lower plate that has been separated by the lid opening mechanism 13A, to a reticle alignment scope 15 that is provided at the end of the reticle stage 6. Thereby, it minutely moves for alignments in the XYZ-axes rotational direction on the reticle 6A relative to the alignment mark 15A on the housing of the projection optical system 7.

The aligned reticle 6A is chucked on the reticle stage 6 directly from the cassette's lower plate. At least one of ascending of the cassette support member or descending of the reticle stage is performed so as to reduce a distance between a cassette support member of an alignment part and the reticle stage 6. At the same time, an inclination is adjusted between the reticle 6A and the reticle stage 6. A vacant cassette's lower plate is returned to the lid opening mechanism 13A by the reticle carrier unit 14B after the reticle 6A is handed to the reticle stage 6, and it is stored in the reticle stocker 12 after the lid is closed.

Figure 2:
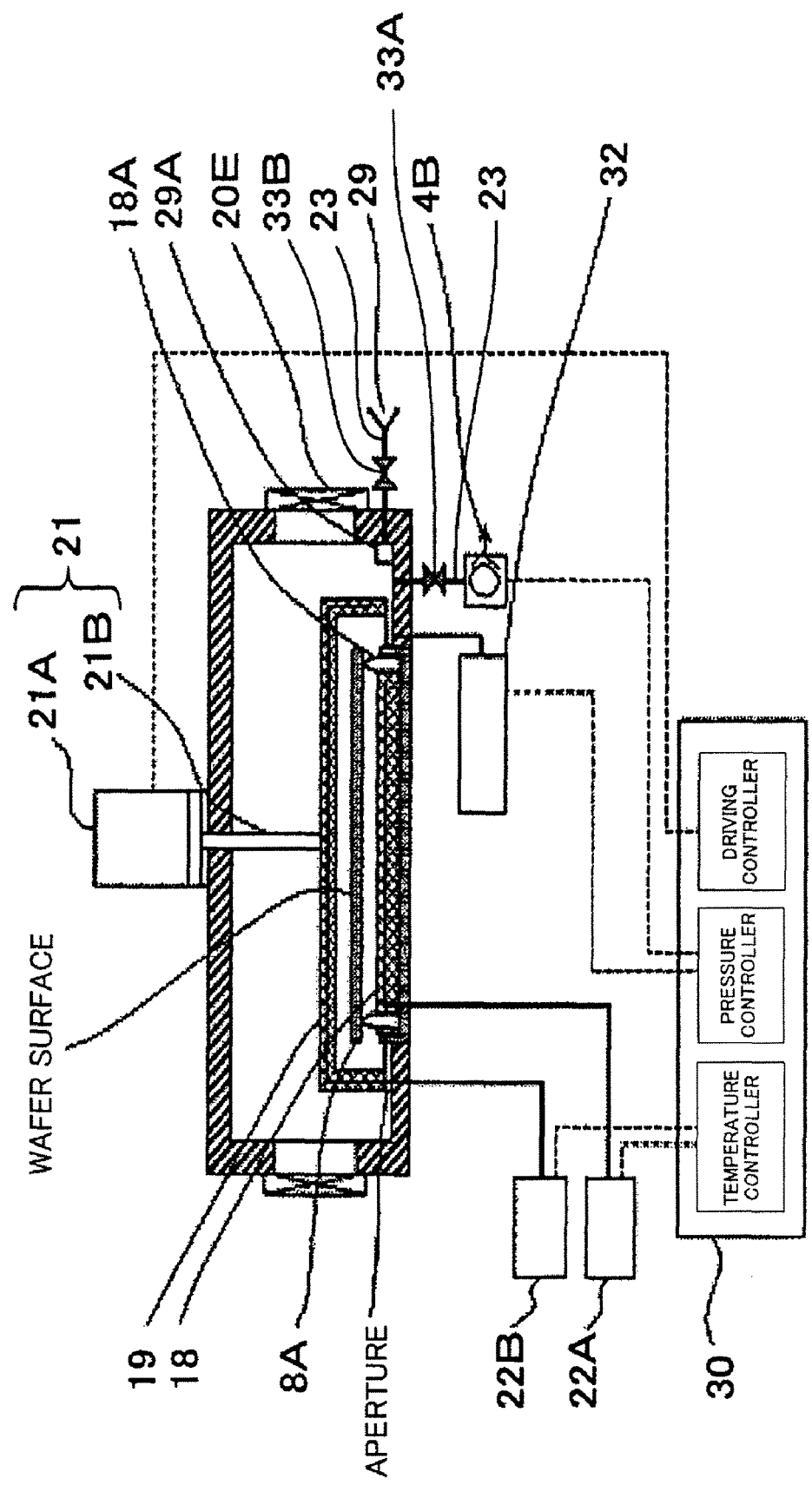
FIG. 2 is a schematic sectional view of a load lock chamber shown in FIG. 1.

FIG. 2 is a schematic sectional view of the load lock chamber 26, in which a driving unit 21 moves the shield 19 as a dust collection unit in the lower direction, and the shield 19 covers the surface of the wafer 8A. The driving unit 21 serves to move one of the holding unit 18 and the shield 19 close to the other after the temperature control units 22A and 22B control the temperature of the surface of the shield 19 opposite to the wafer 8A.

Since a narrow space having a distance of 0.5 cm or smaller can be made between the wafer surface and the shield 19 by moving the shield 19, the temperature gradient of the space can be made larger near the wafer surface than that of the conventional vacuum chamber.

The load lock chamber 26 is partitioned from the exposure chamber 3 by the gate valve 20E, and the pressure detection unit 32 detects that the inside of the load lock chamber becomes vacuum. The gate valve 20E is opened, and the wafer 8A is imported into or exported from the exposure chamber 3. The exhausting unit 4B exhausts or decompresses the internal space of the load lock chamber 26, and the air supply unit 29 supplies the air to or compresses the internal space. Thus, the load lock chamber 26 exchanges the atmosphere of the internal space between the vacuum environment and the atmospheric environment.

A flow variable valve 33A is provided to adjust the exhaust flow and the air supply flow to a pipe 23 between the exhausting unit 4B and an exhaust opening of the load lock chamber 26. The pipe 23 between the air supply unit 29 and an air supply opening of the load lock chamber 26 is provided with a flow variable valve 33B to adjust the exhaust flow and the air supply flow. A pressure detection unit 32 and the control unit 30 that controls the exhaust/air-supply unit can arbitrarily adjust the gas flow in the pipe 23.

Whenever the pretreatment or post-treatment wafer 8A is fed in and out of the load lock chamber 26, the air supply and the exhaust are repeated. Thereby, particles, such as fine fluorine particles generated from the gate valve in the load lock chamber 26 or fine silverplating particles generated from the wafer transport mechanism, are likely to swirl in the exhaust or air supply process, and adhere to the wafer 8A. It is thus important to reduce particles that would adhere to the wafer 8A in the exhaust or air supply process of the load lock chamber 26.

The holding unit 18 that holds the wafer 8A controls the temperatures of all members that includes a support pin 18A to a first temperature (23° C.) through a first temperature control unit 22A. This temperature is as high as the temperature of the wafer 8A transported by the holding unit 18. This embodiment circulates the heat medium in the holding unit 18, and uniformly controls the temperature of the entire surface of the holding unit 18. The temperature of the surface opposite to the wafer surface of the shield 19 used to protect the wafer surface from the particles is controlled to the second temperature (13° C.) by a second temperature control unit 22B. The second temperature of the surface of the shield 19 is lower than the first temperature by 10° C. Thus, the temperature control units 22A and 22B can control the temperature of the surface of the shield 19 opposite to the wafer 8A to the temperature lower than that of the wafer 8A. Thereby, the shield 19 operates as a dust collection unit that has a dust collection part.

Figure 3:
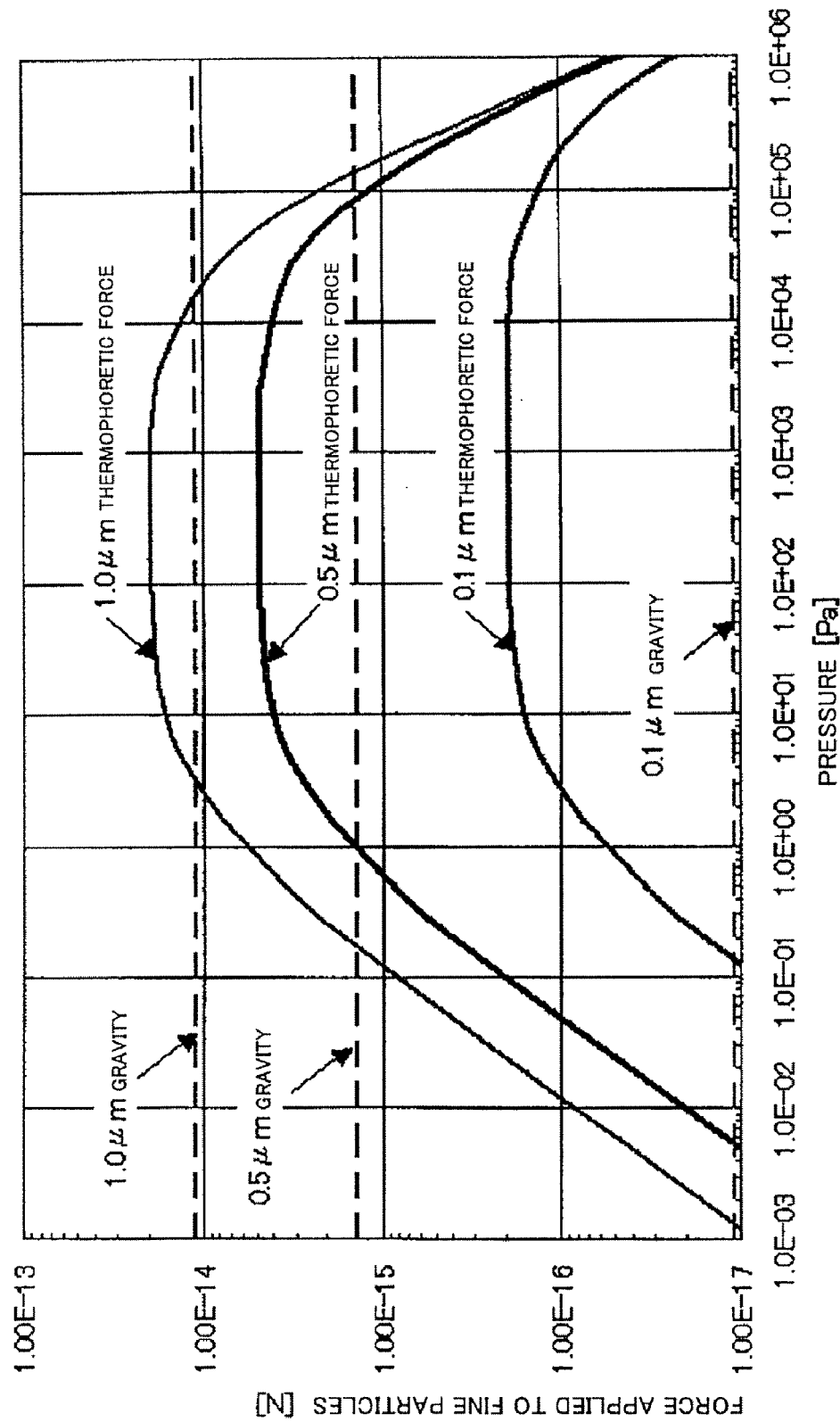
FIG. 3 is a graph that indicates the thermophoretic force that affects fine fluorine particles that float in the load lock chamber shown in FIG. 1.

FIG. 3 is a graph between the gravity and the thermophoretic force affecting the fine fluorine particles when the temperature gradient is 10 [K/cm]. The ordinate axis denotes a force [m/s²], and an abscissa axis denotes a pressure [Pa] of the load lock chamber 26. The thermophoretic force curve is calculated by weighing Equation 1, and a difference between the gas temperature and the solid temperature. It is understood from FIG. 3 that the force affecting the fine particles becomes maximum under a pressure range between 10 Pa and 10,000 Pa. The pressure of the load lock chamber 26 is controlled within the pressure range.

This embodiment controls the temperature and the position of the shield 19 so that the temperature gradient of the space can be 10 [K/cm], and further controls the pressure of the load lock chamber 26.

Figure 4:
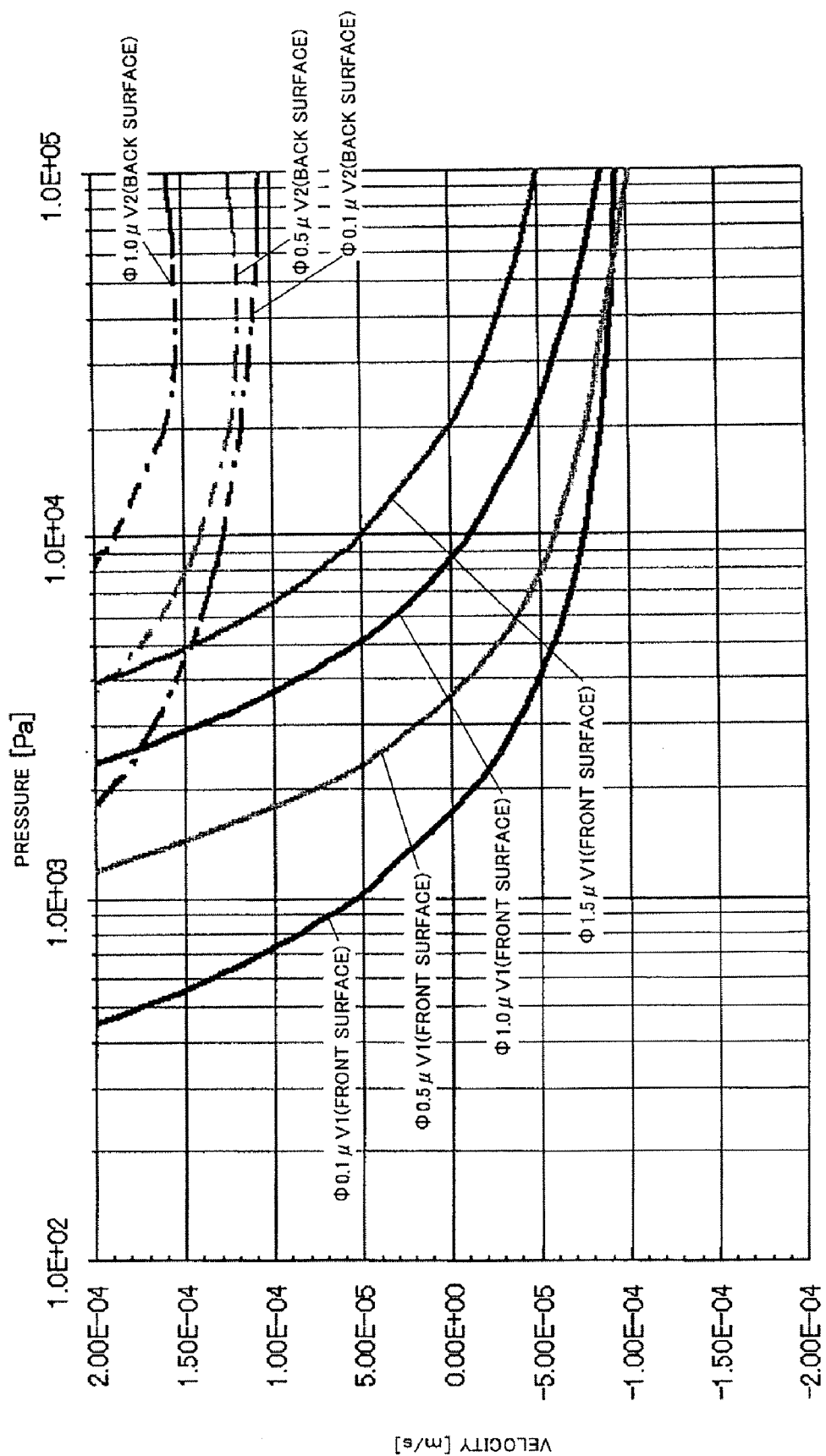
FIG. 4 is a graph showing a relationship between the moving velocity and the pressure of the fine fluorine particle.

FIG. 4 is a graph showing the velocity of the fine fluorine particles having diameters between 0.1 to 1.5 μm that float near the wafer 8A in the load lock chamber 26. The ordinate axis denotes the velocity [m/s] of the fine particle, and the abscissa axis denotes the pressure [Pa] of the load lock chamber 26. The velocity is positive in the gravity direction. Velocity $V_1$ of the fine particle floating near the wafer's front surface is illustrated by a solid line. Velocity $V_2$ of the fine particle floating near the wafer's back surface is illustrated by an alternate long and short dash line. The velocity of the fine particle floating near the surface is given as follows:

$V_1$=(average deposition velocity)+(thermophoretic velocity)

$V_2$=(average deposition velocity)−(thermophoretic velocity)   EQUATION 2

The thermophoretic velocity is given as follows:

$V_{th} = -K_{th} \nu \Delta T/T$   EQUATION 3

The thermophoretic velocity coefficient $K_{th}$ is given as follows:

$$K_{th} = 2.294 \cdot \frac{(\alpha + 2.20 K_n)\{1 + K_n(1.2 + 0.41 e^{-0.88/K_n})\}}{(1 + 3.438 K_n)(1 + 2\alpha + 4.40 K_n)}$$

$\nu$ is a kinematic viscosity. $\alpha$ is a specific-heat ratio, and given as a heat conduction ratio of a gas divided by a heat conduction ratio of a particle. The average deposition velocity to the wafer 8A in the laminar flow field is given as follows.

$v_n = 0.739 (D/L)(u_0 L/\nu)^{1/2} S_c^{1/3} + V_g$

D is a diffusion coefficient and given by $C_c kT/(3\pi\mu D_p)$. L is a wafer diameter. $u_0$ is an average flow rate of the airflow sufficiently distant from the wafer 8A. $S_c$ is a Schmidt number and is given by $\nu/D$. k is a Boltzmann's factor. $v_g$ is a gravity deposition velocity of $D_p^2 \rho_p g C_c/(18\mu)$. $\rho_p$ is a density of a fine particle. g is gravity acceleration. $C_c$ is a Cunnningham's correction coefficient, and given by $1+K_n[1.25+0.4 \exp(-1.1/K_n)]$.

EQUATIONS 2 to 4 are disclosed in Takeshi Hattori edition, Realize Science & Engineering Center Publisher, "New Edition Cleaning Technology of Silicon Wafer Surface," May of 2000, pp. 72-74.

Figure 5:
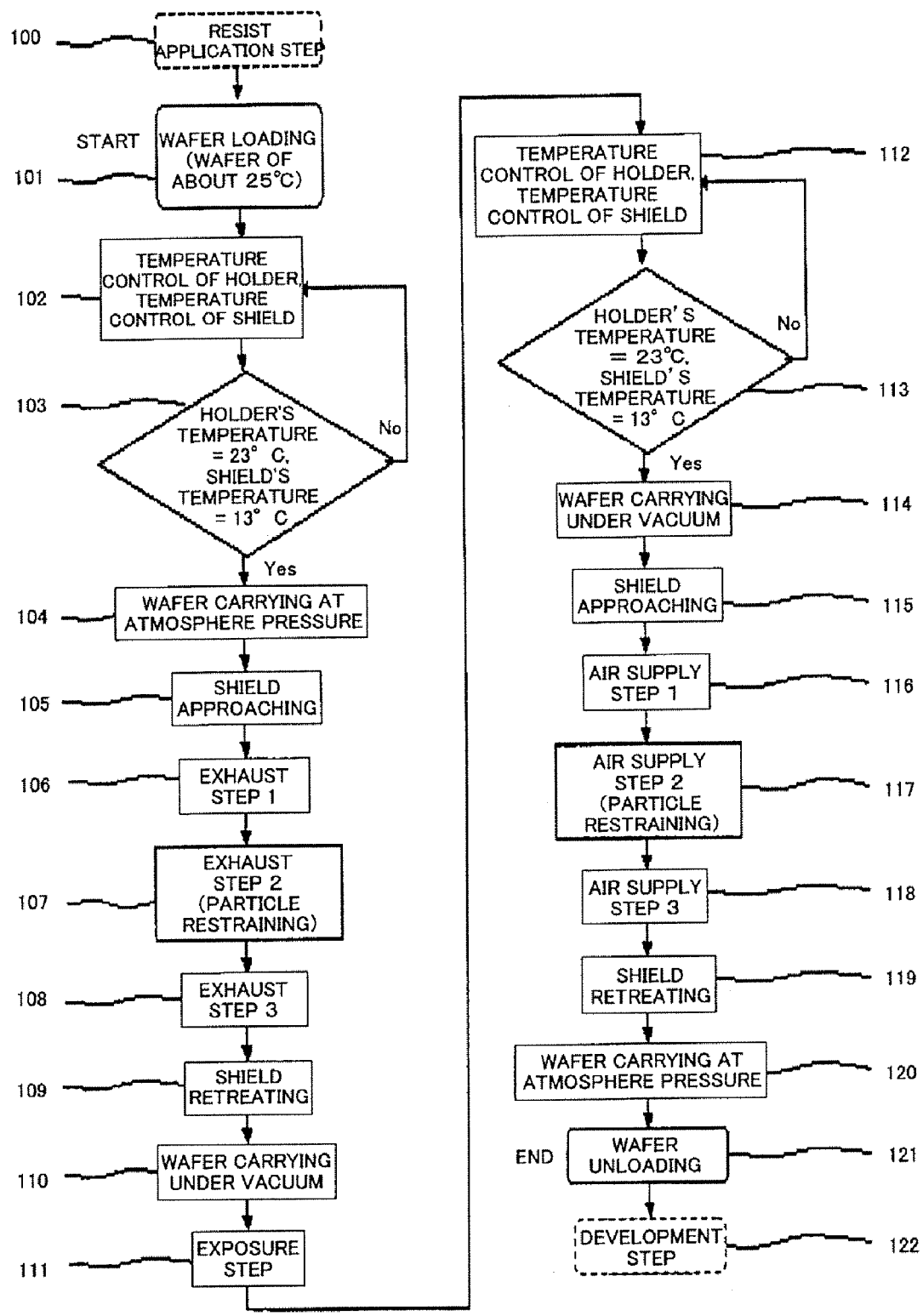
FIG. 5 is a flowchart according to the first embodiment of the present invention.
Figure 6A:
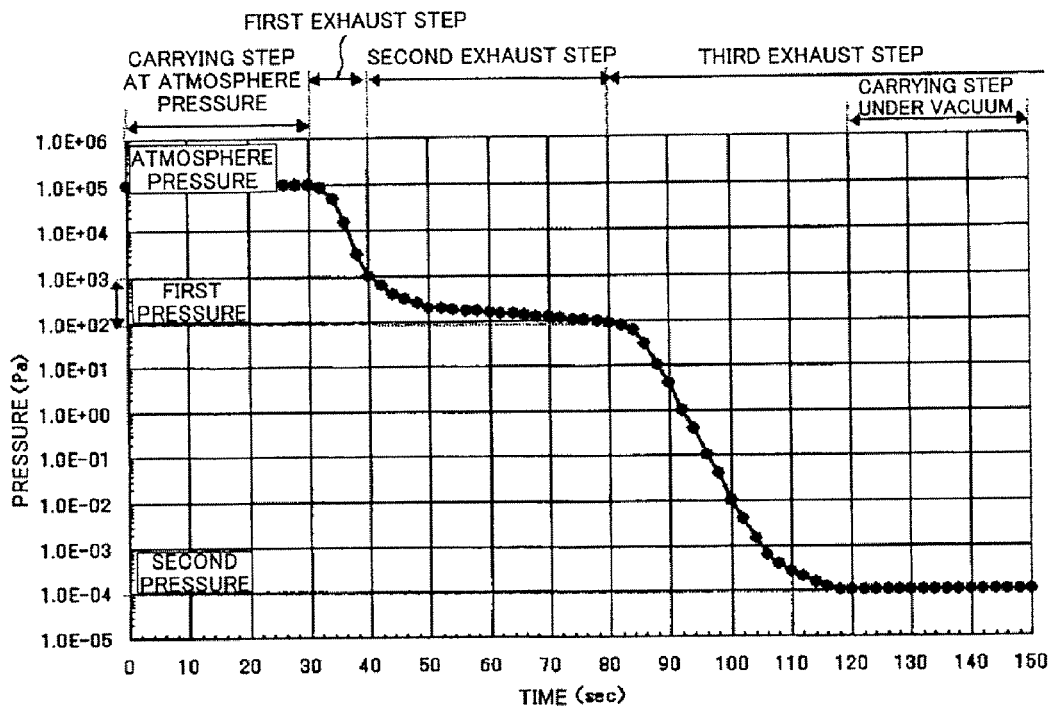
FIG. 6 is a graph of a pressure curve of the load lock chamber according to the first embodiment of the present invention.
Figure 6B:
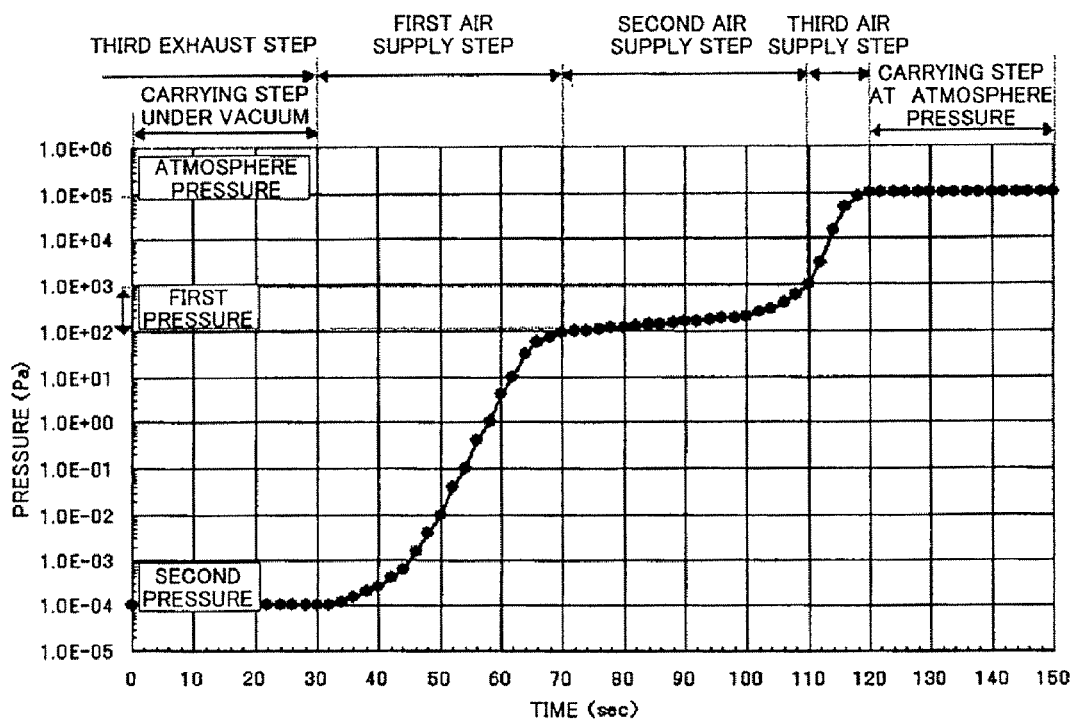

FIG. 5 is a flowchart of a wafer process according to a first embodiment. FIG. 6A is a graph showing an exhaust step of the load lock chamber 26 according to the first embodiment. The ordinate axis denotes the pressure [Pa] of the load lock chamber 26, and the abscissa axis denotes an exhaust time period [second]. FIG. 6B is a graph showing an air supply step of the load lock chamber 26 according to the first embodiment. The ordinate axis denotes the pressure [Pa] of the load lock chamber 26, and the abscissa axis denotes an air supply time period [second]. In FIGS. 6A and 6B, E±XX denotes $\times 10^{\pm XX}$.

The first embodiment is suitable for example for fine fluorine particles having diameters of 1.0 μm. As shown in FIG. 4, the moving velocity of a fine fluorine particle having a diameter of 1.0 μm that floats in the load lock chamber 26 in a direction opposite to the wafer 8A becomes maximum at a pressure range between 3.0E+04 Pa and 5.0E+04 Pa. A time period necessary to move a distance of 0.05 mm from the wafer 8A to the shield 19 is 27 seconds. Therefore, by maintaining the pressure between 3.0E+04 and 5.0E+04 Pa for 27 seconds or greater, the fine fluorine particles having diameters of 1.0 μm which float between the wafer surface and the shield 19 collide with the shield 19 at least once. The collision is likely to induce the fine particle to adhere to the shield 19, and thus reduce a fine particle's adhesion to the wafer surface. This embodiment sets the pressure range between 3.0E−04 Pa and 5.0E−04 Pa to a first pressure, and reduces the adhesions of the fine particles to the wafer 8A utilizing the thermophoretic force that is generated in this pressure range. This embodiment discusses the fine fluorine particles having specific gravity of 2,130 kg/m$^3$ in an example, but this embodiment is applicable to other fine particles having different specific gravity.

In FIG. 5, S100 is a resist application step that feeds the wafer 8A that has undergone the application step, to the exposure apparatus. S101 is a step that loads the wafer 8A to the wafer stocker in the exposure apparatus.

S102 is a step that controls the temperature of the holding unit 18 to the temperature (24° C.) lower by about 1° C. than that of the wafer 8A imported from the wafer stocker 16, and controls the temperature of the shield 19 to 4° C. This step effectively prevents adhesions of the fine particles to the wafer 8A by utilizing the thermophoretic force by holding the temperature of the shield 19 lower than that of the wafer 8A. S103 detects or checks completions of the temperature controls over the holding unit 18 and the shield 19 utilizing a temperature sensor (not shown). Upon completions of the temperature controls, the procedure proceeds to the next step. When the temperature controls have not yet been completed, the procedure returns to the previous step S102.

S104 is a step that opens the gate valve 20D, carries the wafer 8A to the holding unit 18, and holds there, before the load lock chamber 26 is exhausted or in the atmosphere pressure. After the wafer 8A is carried, the gate valve 20D closes. When the load lock chamber 26 is at the atmosphere pressure, the fine particles having diameters of 1.0 μm or smaller do not fall due to the gravity, but float due to the airflow and the Brownian motions. The fine particles having diameters greater than 1.0 μm move in the gravity direction, and would adhere to the wafer 8A. However, the shield 19 encloses the wafer 8A in the load lock chamber 26, and thus the adhesion probability to the wafer 8A reduces.

When the density of the fine particles that float in the space between the shield 19 and the wafer 8A is equal to that of the fine particles that float in another space, the effect increases as a ratio between the volume near the wafer 8A inside the shield and the volume outside the shield increases. In this embodiment, the volume ratio is about 0.003. Therefore, if 1,000 fine particles move in the gravity direction in the load lock chamber, only three fine particles of them adhere to the wafer 8A and the adhesion number of fine particles reduces.

S105 is a step of moving the shield 19 towards the holding unit 18, and of bringing the shield 19 close to the wafer 8A so as to enclose the wafer 8A. The wafer 8A is wholly enclosed with a small space having a distance of 0.5 cm between the shield 19 and the surface of the wafer 8A. This embodiment provides the shield 19 with an aperture that has a conductance that can be exhausted and air-supplied simultaneous with the load lock chamber 26. Therefore, the inside of the shield 19 can be exhausted and air-supplied simultaneous with the load lock chamber 26. This embodiment controls the temperature and the position of the shield 19 so that the space between the shield 19 and the wafer 8A has a temperature gradient of 40 [K/cm].

S106 is a first exhaust step, which uses the exhausting unit 4B to reduce the pressure of the load lock chamber 26 from the atmosphere pressure state down to 5.0E+04 Pa. When the conventional load lock chamber 26 is decompressed, the fine particles having diameters of 1.0 μm or smaller start moving in the gravity direction. On the other hand, in the load lock chamber 26 of this embodiment, the fine particles having diameters of 1.0 μm or smaller move towards the shield 19 rather than in the gravity direction due to the thermophoretic force. In addition, as illustrated by the graph of FIG. 4, the gravity exceeds the thermophoretic force for the fine particles having diameters of 1.5 μm or greater, and they cannot move towards the shield 19.

S107 is a second exhaust step, which reduces the pressure of the load lock chamber 26 at a constant exhaust rate, as shown in FIG. 6A, so that the pressure of the load lock chamber 26 can fall in a range between 5.0E+04 Pa and 3.0E+04 Pa, and maintains the first pressure for a minimum time period that provides an effect of the thermophoretic force. This embodiment provides control that makes small an aperture degree of the flow variable valve 33A when the pressure of the load lock chamber 26 reaches 5.0E+04 Pa so that the exhaust speed of this embodiment is smaller than that of the first exhaust step. Parts of the fine particles that collide with the shield 19 adhere to the shield 19 due to the adhesion force of the van der Waals' force.

This embodiment requires 40 seconds to move the fine fluorine particle of 1.0 μm to the shield 19 placed distant from the surface of the wafer 8A in upper direction by 0.5 cm. In other words, within 40 seconds, the pressure is reduced to a range between 5.0E+04 and 3.0E+04 Pa, and the fine particle is collected. The time period can be adjusted by the specific gravity of the fine particle, which is most concerned in the processing step of the wafer 8A.

S108 is a third exhaust step, which vacuum-pumps the first pressure that ranges from 5.0E+04 to 3.0E+04 Pa to a second pressure of 1.0E−04 Pa. S109 is a step for moving the shield 19 in a direction opposite to the holding unit 18. The shield 19 retreats to an appropriate position, and enables the wafer 8A to be carried by the carrier unit 17B.

In general, it is sufficient that the second exhaust step controls the temperature of the shield 19 installed in the load lock chamber to the temperature lower than that of the substrate while maintaining the pressure range between 10 Pa and 10000 Pa for a time period from 10 seconds to 600 seconds. The "pressure range between 10 Pa and 10,000 Pa" is a range of 98% of a maximum or maximum value of the thermophoretic force obtained from FIG. 3. A time period of 10 seconds is a minimum time period necessary for the fine fluorine particle having a diameter of 1.0 μm to move to the shield 19, where a distance between the wafer 8A and the shield 19 is 0.2 cm, and a temperature gradient of a space between the shield 19 and the wafer 8A is 100 [K/cm]. A time period of 600 seconds is a maximum time period necessary for the fine fluorine particle having a diameter of 1.0 μm to move to the shield 19, where a distance between the wafer 8A and the shield 19 is 1.0 cm, and a temperature gradient of a space between the shield 19 and the wafer 8A is 10 [K/cm]. Although the exhaust speed monotonously decreases in the second exhaust step in FIG. 6A, its gradient is not limited. Although the gradient of the second exhaust step in FIG. 6A is different from gradients of the first exhaust step and the third exhaust step, the exhaust speeds of the first to third exhaust steps may monotonously decrease. This is true of second and third embodiments which will be described with reference to FIGS. 7 and 8.

S110 is a carrying step under vacuum, which carries the wafer 8A to the exposure chamber 3 utilizing the carrier unit 17B after opening the gate valve 20E while maintaining the second pressure by vacuum-pumping the load lock chamber 26. After the transport, the gate valve 20E closes. Few fine particles float in the load lock chamber 26 in this step, and the transport is less likely to cause their adhesions to the wafer 8A.

S111 is an exposure process. S112 is the same as S102, and thus a description thereof will be omitted. S113 is a step that controls the temperature of the holder 18 to the temperature of 22° C. lower by 1° C. than that of the wafer to be carried from the exposure chamber 3, and controls the temperature of the shield 19 to 12° C. S114 is a carrying step under vacuum, which carries the wafer 8A to the holding unit 18 in the load lock chamber 26 by the carrier unit 17B after opening the gate valve 20E while the load lock chamber 26 is in the second pressure state, and holds the wafer there. After the transport, the gate valve 20E closes.

S115 is a step of moving the shield 19 toward the holding unit 18. Since this step is similar to S105, a description thereof will be omitted. S116 is a first air supply step, which supplies air so that the pressure in the load lock chamber 26 becomes 3.0E+0.4 Pa from the second pressure 1E-04 Pa.

S117 is a second air supply step, which supplies air until the pressure in the load lock chamber 26 becomes 5.0E+04 Pa. In the first air supply step, the fine particles that have swirled in the load lock chamber fall, but the thermophoretic force applies near the wafer 8A, and moves them to the shield 19, reducing their adhesions to the wafer 8A. Similar to S107, this embodiment sets a time period to 40 seconds necessary to move the fine fluorine particles of 1.0 μm to the shield 19 that is placed distant from the surface of the wafer 8A in upper direction by 0.5 cm.

S118 is a third air supply step, which supplies air until the pressure in the load lock chamber 26 can be an atmosphere pressure. In this step, the fine particles float, which have swirled in the first and second air supply steps. The shield 19 encloses the wafer 8A, and reduces the adhesions of the fine particles to the wafer 8A. S119 is a retreating step of the shield 19 to an appropriate position in which the wafer carrier unit 17A can carry the wafer 8A. S120 is a carrying step of the wafer 8A in the load lock chamber 26 at the atmosphere pressure to the wafer stocker 16. S121 is a step that unloads the wafer from the wafer stocker in the exposure apparatus to the atmospheric air side.

In general, similar to the second exhaust step, it is sufficient that the second air supply step controls the temperature of the shield 19 installed in the load lock chamber lower than that of the substrate while maintaining the pressure range between 10 Pa and 10,000 Pa for a time period from 10 seconds to 600 seconds. The "pressure range between 10 Pa and 10000 Pa" and the "time period from 10 seconds to 600 seconds" are required for the same reasons as those for the second exhaust step. Although the air supply speed monotonously decreases in the second air supply step in FIG. 6B, its gradient is not limited. Although the gradient of the second air supply step in FIG. 6B is different from gradients of the first air supply step and the third air supply step, the air supply speeds of the first to third air supply steps may monotonously increase. This is true of second and third embodiments which will be described with reference to FIGS. 7B and 8B.

From the above description, in the exhaust/air supply steps of the load lock chamber 26, the maintenance of the first pressure range between 5.0E+04 Pa and 3.0E+04 Pa for a certain time period maximizes the thermophoretic force, and reduces adhesions of the fine particles to the wafer surface.

Second Embodiment

Figure 7A:
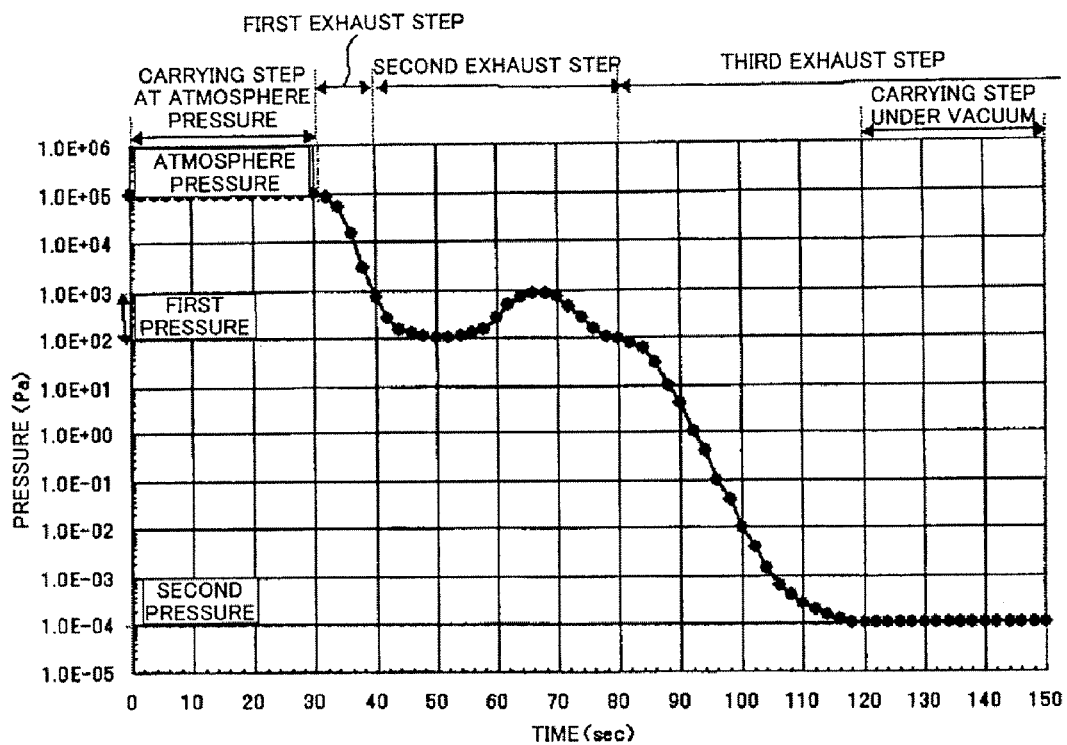
FIG. 7 is a graph of a pressure curve of the load lock chamber according to a second embodiment of the present invention.
Figure 7B:
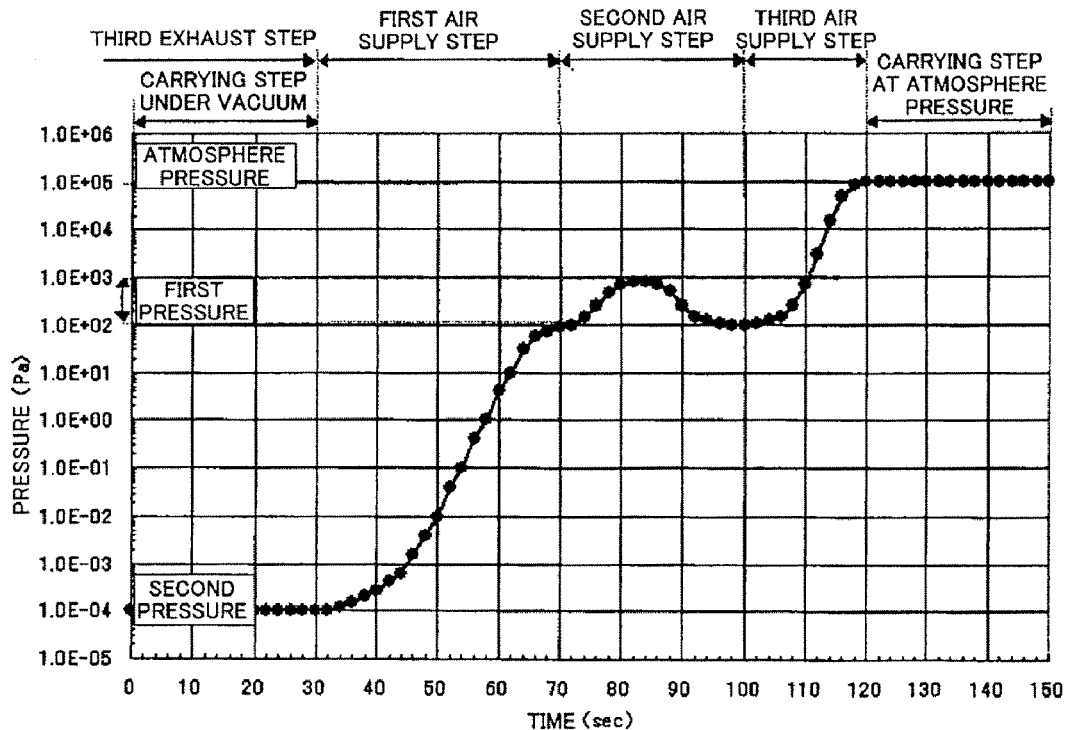

This embodiment is different from the first embodiment in that this embodiment allows the pressure in the load lock chamber 26 to fluctuate in a certain pressure range in the second exhaust step S107 and the second air supply step S117. FIG. 7A is a graph showing an exhaust step of the load lock chamber 26 according to the second embodiment. The ordinate axis denotes the pressure [Pa] of the load lock chamber 26, and the abscissa axis denotes an exhaust time period [second]. FIG. 7B is a graph showing an air supply step of the load lock chamber 26 according to the second embodiment. The ordinate axis denotes the pressure [Pa] of the load lock chamber 26, and the abscissa axis denotes an air supply time period [second].

A description will be given of a second exhaust step S107, which reduces the pressure of the load lock chamber 26 down to a range between 3.0E+04 Pa and 5.0E+04 Pa. When the pressure of the load lock chamber 26 reaches 100 Pa, the exhaust valve closes and the exhaust temporarily stops. This action reduces the Brownian motion of the gas that affects the fine particles, and can enhance the relative thermophoretic fore. The pressure in the load lock chamber 26 gradually increases due to emitted and leaked gases, but the thermophoretic force effect is so large in this pressure range that the adhesions of the fine particles can be reduced. In this pressure range, the fine particles inside the shield 19 do not fall due to the gravity, but move to the shield 19 due to the thermophoretic force and adhere to the shield 19.

A description will be given of the second air supply step S117 of the second embodiment. The air is supplied until the pressure in the load lock chamber 26 reaches 100 Pa. As soon as the pressure in the load lock chamber 26 reaches 100 Pa, the flow variable valve 33B is closed to temporarily stop the air supply. This action reduces the Brownian motion of the gas that affects the fine particles, and can enhance the relative thermophoretic force. Thus, the second embodiment can reduce adhesions of the fine particles to the wafer 8A.

Third Embodiment

This embodiment is suitable to reduce the fine fluorine particles having diameters of 1.0 μm. This embodiment is different from the first embodiment in that this embodiment controls the aperture degree of the exhaust valve of the load lock chamber 26 in the second exhaust step, and controls the exhaust flow, and maintains 4.0E+04 Pa. The first pressure of this embodiment is 4.0E+04 Pa.

As shown in FIG. 4, when the pressure of the load lock chamber 26 is 4.0E+04 Pa, the speed in the direction opposite to the gravity becomes maximum, where it takes 215 seconds for the fine particle to move a distance from the wafer 8A to the shield 19. Therefore, the fine particles that float between the wafer surface and the shield 19 collide with the shield 19 at least once by maintaining the pressure state of 4.0E+04 Pa for 215 seconds. The collision is likely to induce the fine particle to adhere to the shield 19, and thus reduce a fine particle's adhesion to the wafer surface.

It takes 221 seconds for the fine particle to move to the shield at the pressure of 3.0E-04 Pa of the load lock chamber 26, and it takes 230 seconds at the pressure of 5.0E-04 Pa, reducing the throughput of the apparatus. Therefore, this embodiment sets the pressure of 4.0E+04 Pa to the first pressure, and utilizes the thermophoretic force generated in this pressure range to reduce the adhesions of the fine particles to the wafer 8A. This configuration reduces the fine particles having large diameters and large masses within a minimum time period.

Figure 8A:
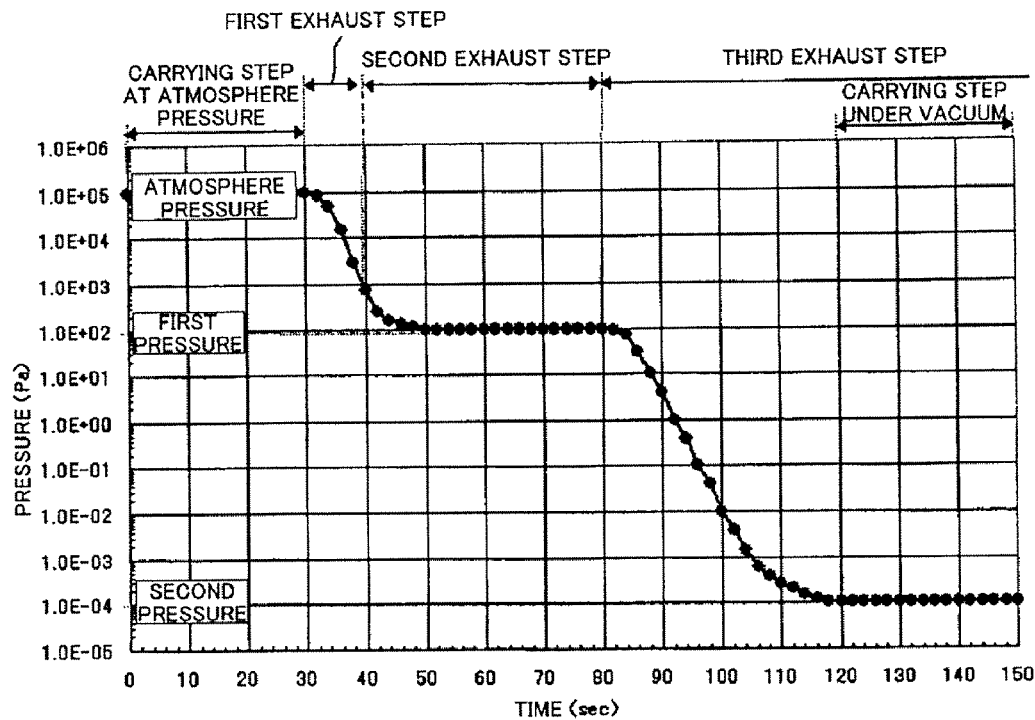
FIG. 8 is a graph of a pressure curve of the load lock chamber according to a third embodiment of the present invention.

FIG. 8A is a graph showing an exhaust step of the load lock chamber 26 according to the third embodiment. The ordinate axis denotes the pressure [Pa] of the load lock chamber 26, and the abscissa axis denotes a time period [second]. FIG. 8A specifies the carrying step at the atmosphere pressure, the first exhaust step, the second exhaust step, and the third exhaust step, and the carrying step under vacuum as well as the carrying step of the wafer 8A, and the moving step of the shield 19. This embodiment is different from the first embodiment in the second exhaust step.

A description will now be given of the second exhaust step, which switches to the slow exhaust so as to maintain 500 Pa and provides the slow exhaust and the slow air supply, after the pressure of the load lock chamber 26 reaches 500 Pa. The exhaust flow of the load lock chamber 26 is controlled by controlling the aperture degree of the flow variable valve 33A provided between the exhausting unit 4B and the load lock chamber 26. The air supply flow of the load lock chamber 26 is controlled by controlling the aperture degree of the flow variable valve 33B provided between the air supply unit 29 and the load lock chamber 26.

Figure 8B:
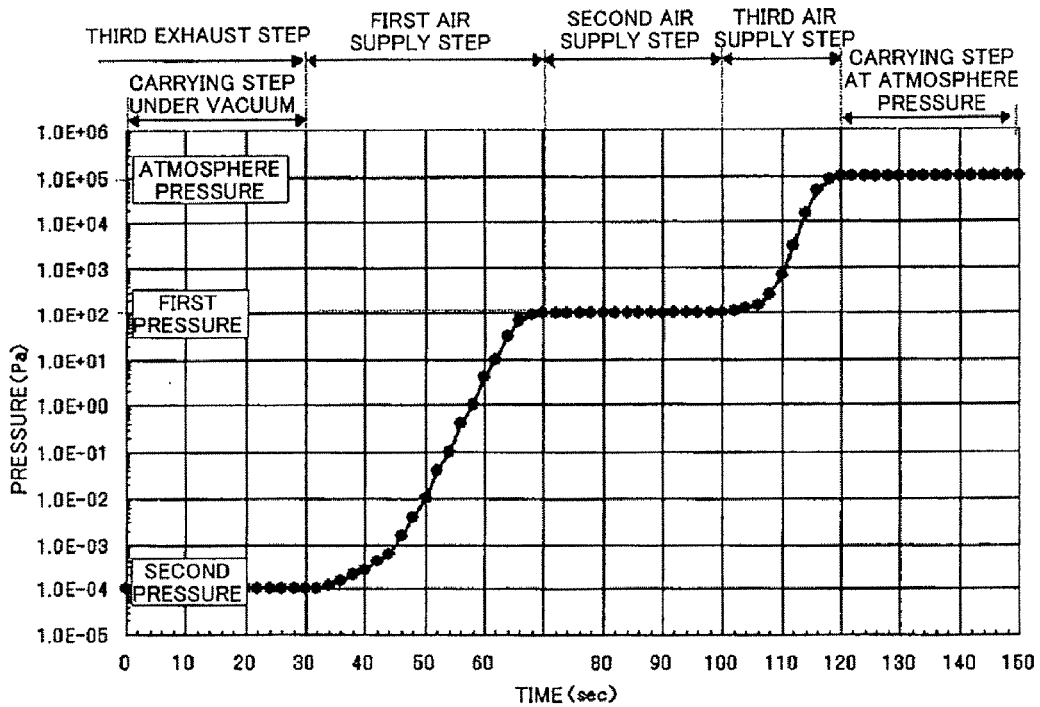

FIG. 8B is a graph showing an air supply step of the load lock chamber 26 according to this embodiment. The ordinate axis denotes the pressure [Pa] of the load lock chamber 26, and the abscissa axis denotes a time period [second]. FIG. 8B specifies the carrying step under vacuum, the first air supply step, the second air supply step, and the third air supply step, and the carrying step at the atmosphere pressure as well as the carrying step of the wafer 8A, and the moving step of the shield 19. This embodiment is different from the first embodiment in the second air supply step. Control similar to that of the second air supply step maintains 500 Pa in the load lock chamber 26.

The load lock chamber 26 of the third embodiment can always generate a maximum thermophoretic force, and provide a greater effect of the adhesion reduction of the fine particle than those of the load lock chamber 26 in the first and second embodiments. Therefore, the third embodiment reduces the adhesions of the fine particles to the wafer 8A.

While the above embodiments discuss an application to a semiconductor wafer as a silicon substrate, the substrate to which the present invention is applicable is not limited to the wafer. The vacuum chamber allows the thermophoretic force to apply to the floating particles near the substrate surface, and can reduce the particles' adhesions to the substrate surface. While this embodiment arranges the surface of the substrate perpendicular to the gravity direction, the present invention does not limit the orientation of the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims a foreign priority benefit based on Japanese Patent Applications Nos. 2007-100301, filed on Apr. 6, 2007, and 2008-075897, filed on Mar. 24, 2008, which is hereby incorporated by reference herein in its entirety as if fully set forth herein.

What is claimed is:

1. A method of exchanging an atmosphere of a vacuum chamber of an exposure apparatus which includes a load lock chamber, the exposure apparatus being configured to expose a substrate to exposure light in the vacuum chamber under a vacuum environment having a first gas pressure, the method comprising steps of:

loading the substrate into the load lock chamber in which a gas pressure is changed between the first gas pressure and a second gas pressure higher than the first gas pressure, and through which the substrate having a first temperature is transferred to or from the vacuum chamber;

controlling a temperature of the substrate such that the temperature of the substrate is kept at the first temperature;

exchanging the atmosphere of the load lock chamber between the first gas pressure and the second gas pressure, wherein the exchanging step maintains a pressure of the load lock chamber within a predetermined pressure range for a predetermined time period; and controlling a temperature of a dust collection unit provided in the load lock chamber such that the temperature of the dust collection unit is kept lower than the first temperature of the substrate, wherein the predetermined pressure range and the predetermined time period correspond to a specific gravity and size of dust to be collected by the dust collection unit, wherein the load lock chamber further includes a holding unit configured to hold the substrate, and a driving unit configured to move the dust collection unit and the holding unit relative to each other, and wherein controlling the temperature of the dust collection unit includes controlling the driving unit so that a distance between the dust collection unit and the substrate changes so as to generate a predetermined temperature gradient therebetween.

2. A method according to claim 1, further comprising a step of bringing one of the substrate and the dust collection unit close to the other.

3. A method according to claim 2, wherein, upon bringing one of the substrate and the dust collection unit close to the other, a temperature gradient of a space between the substrate and the dust collection unit becomes 10 K/cm or higher.

4. A method according to claim 1, wherein the vacuum chamber is connected to the load lock chamber via a gate valve.

5. A method according to claim 1, wherein the predetermined pressure range is in a range between 10 Pa and 10000 Pa, and the predetermined time period is in a range between 10 seconds and 600 seconds.

6. A method according to claim 1, wherein moving the dust collection unit and the holding unit relative to each other includes moving the dust collection unit in a direction towards the holding unit, so that the dust collection unit covers the substrate.

7. A method according to claim 1, wherein controlling the temperature of the dust collection unit includes controlling a temperature gradient of a space between the substrate and the dust collection unit such that a temperature of a surface of the dust collection unit facing the substrate is lower than a temperature of a surface of the substrate facing the dust collection unit.

8. A method according to claim 1, further comprising transferring the substrate to or from the vacuum chamber via the load lock chamber and exposing the substrate to the exposure light in the vacuum chamber, wherein the exposure light includes extreme ultraviolet light.

9. A method according to claim 1, wherein the dust collection unit encloses the substrate so as to reduce adhesion of the dust to the substrate.

* * * * *